(12) United States Patent
Kronenberger

(10) Patent No.: US 11,958,740 B2
(45) Date of Patent: Apr. 16, 2024

(54) METHOD FOR PRODUCING A MICROELECTROMECHANICAL SENSOR AND MICROELECTROMECHANICAL SENSOR

(71) Applicant: Robert Bosch GmbH, Stuttgart (DE)

(72) Inventor: Achim Kronenberger, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/276,450

(22) PCT Filed: Oct. 30, 2019

(86) PCT No.: PCT/EP2019/079579
§ 371 (c)(1),
(2) Date: Mar. 15, 2021

(87) PCT Pub. No.: WO2020/099127
PCT Pub. Date: May 22, 2020

(65) Prior Publication Data
US 2022/0033256 A1  Feb. 3, 2022

(30) Foreign Application Priority Data

Nov. 15, 2018 (DE) ..................... 10 2018 219 524.2

(51) Int. Cl.
*B81C 1/00* (2006.01)
*B81B 7/00* (2006.01)
(52) U.S. Cl.
CPC ........ *B81C 1/00801* (2013.01); *B81B 7/0025* (2013.01); *B81B 2203/0109* (2013.01); *B81C 2201/014* (2013.01); *B81C 2203/0109* (2013.01)

(58) Field of Classification Search
CPC ... B81B 7/0058; B81B 3/0051; B81B 7/0025; B81B 2203/0109; B81C 1/00801;
(Continued)

(56) References Cited

U.S. PATENT DOCUMENTS 6,465,854 B1   10/2002  Muenzel et al.
2002/0104379 A1*  8/2002  Ried ..................... G01P 15/125
                                                     73/514.32
(Continued)

FOREIGN PATENT DOCUMENTS

DE          69405003 T2   2/1998
DE      102007002725 A1   7/2008
(Continued)

OTHER PUBLICATIONS

International Search Report for PCT/EP2019/079579, dated Jan. 23, 2020.

*Primary Examiner* — Shahed Ahmed
*Assistant Examiner* — Sun Mi Kim King
(74) *Attorney, Agent, or Firm* — NORTON ROSE FULBRIGHT US LLP; Gerard A. Messina

(57) ABSTRACT

A method for producing a microelectromechanical sensor. The microelectromechanical sensor is produced by connecting a cap wafer to a sensor wafer. The cap wafer has a bonding structure for connecting the cap wafer to the sensor wafer. The sensor wafer has a sensor core having a movable structure. The cap wafer has a stop structure for limiting an excursion of the movable structure. The method includes a first step and a second step following the first step, the stop surface of the stop structure being situated at the level of the original surface of the unprocessed cap wafer.

5 Claims, 10 Drawing Sheets

(58) Field of Classification Search
CPC ...... B81C 2201/014; B81C 2203/0109; B81C 2203/019; B81C 1/00134; B81C 3/001; G01P 15/0802
See application file for complete search history.

(56) References Cited

U.S. PATENT DOCUMENTS

| | | |
|---|---|---|
| 2013/0043510 A1* | 2/2013 | Shu ................ B81C 1/00269 |
| | | 438/51 |
| 2014/0110800 A1 | 4/2014 | Classen et al. |
| 2015/0210537 A1 | 7/2015 | Chang et al. |
| 2017/0210618 A1* | 7/2017 | Chang ................ B81B 3/0021 |
| 2017/0334711 A1 | 11/2017 | Chang et al. |
| 2018/0202807 A1 | 7/2018 | Schelling et al. |
| 2019/0161342 A1* | 5/2019 | Tai ................ B81C 1/00333 |

FOREIGN PATENT DOCUMENTS

| | | |
|---|---|---|
| DE | 102014211333 A1 | 12/2015 |
| DE | 102016218661 A1 | 3/2018 |

* cited by examiner

METHOD FOR PRODUCING A MICROELECTROMECHANICAL SENSOR AND MICROELECTROMECHANICAL SENSOR

FIELD

The present invention relates to a method for producing a microelectromechanical sensor.

BACKGROUND INFORMATION

Microelectromechanical sensors, in particular in the form of inertial sensors, are available the related art in many different specific embodiments. The functional principle of such sensors is generally that an external linear acceleration or rotation applied to the sensor causes inertial forces that cause excursions or deflections of a movable structure in the sensor core, via which the acceleration or rotation can be measured. The movable structure can be etched from a single layer or can be constructed from a plurality of layers. In particular, the movable structure can be formed by epitaxially depositing a silicon layer on a layer made of functional polysilicon (FP), and, in a following step, preparing from the silicon layer a plurality of substructures that are connected to one another via a bridge, formed from the FP layer, of functional polysilicon (FP bridge).

In order to provide a sealed environment for the sensor core, frequently a cap is attached on the sensor wafer using a wafer bonding method, and in this way the sensor core is enclosed in a cavern. Such a wafer bonding method is in particular eutectic bonding, in which the sensor wafer and the cap wafer are bonded to one another by a eutectic alloy. This alloy is formed by two alloy partners, such as germanium and aluminum, or silicon and gold. For example, here an additional bonding structure made of gold can be attached on one of the two wafers that, through heating during the joining of the wafers, bonds with the silicon of the two wafers, thus forming a solid material bond. Similarly, one of the two wafers can have a bonding structure made of aluminum and the other can have a bonding structure made of germanium, so that the two bonding structures form the desired eutectic bond when joined. The respective bonding structure is formed during the manufacturing of the wafers by depositing a bonding layer and subsequent structuring of the bonding layer by etching. In order to ensure that the bonding structure forms the upper edge of the cap wafer, i.e., that it extends as far as possible past the other structures of the cap wafer, the formation of the bonding structure is standardly carried out before the other structures of the cap wafer are produced by further etching processes.

In order to prevent the sensor from being damaged by particularly strong excursions of the movable structure, as a rule stop structures are situated in the cavern that limit the maximum excursion of the movable structure. For upward excursions (i.e., towards the cap), for example the cap wafer can have a stop surface against which the movable structure impacts when there are large excursions. The height of the stop structures, i.e., the level of the stop surface inside the cap wafer, is here limited by the fact that material is already removed before the preparation of the stop structure, in particular by an overetching that takes place during the formation of the bonding structure. This results in a limiting factor for the distance between the upper edge of the movable structure and the stop surface; in particular, if the distance is too large, it can occur that the functional FP bridge impacts from below against solid structures of the sensor wafer before the movement of the stop surface is caught. The impact can result in breakages of the FP bridge that may damage or even destroy the sensor.

SUMMARY

An object of the present invention is to provide a method in which the stop structures of the cap wafer are produced in such a way that breakages of the functional FP bridges are avoided.

In the method according to an example embodiment of the present invention, the application of the hard mask brings it about that the surface covered by the hard mask does not undergo any material removal in the subsequent etching processes by which the structures of the cap wafer are produced. It has turned out that the application of such a mask is in particular suitable for preventing that the overetching brought about in the production of the bonding structure the height level of the stop surface of a stop structure is reduced.

In order to describe the geometrical relations, below, reference is made to the main plane of extension of the cap or sensor wafer. The direction perpendicular to the main plane of extension is referred to as the vertical direction, without thereby implying a relation to the direction of gravity. The terms "above" and "below" are to be understood in relation to the vertical direction. The cap wafer is structured by successive deposition and etching processes. For each structure, or for each surface, of a structure of the cap wafer oriented parallel to the main plane of extension, a height level is indicated with reference to the vertical direction, and is compared in particular with height levels of other structures and their surfaces. Through successive deposition and etching processes, the cap wafer is provided with various structures, the processing standardly taking place only on one side of the cap wafer, referred to in the following as the upper side. The surface belonging to this side of the unprocessed cap wafer defines the maximum height level of such structures, which are produced exclusively by material removal processes. Such structures produced by removing material are for example the stop structures of the cap wafer, which, after the joining with the sensor wafer, limit the movements of the movable structure of the sensor wafer, at least in the vertical direction, to a maximum excursion. The application of the hard mask ensures that the mask surface, which forms the stop surface of the stop structure later etched from the wafer material, has the maximum available height level, and that the maximum excursion can correspondingly be made small. In the second step of the method according to the present invention, a bonding structure is produced by which, in the following part of the production process, the cap wafer and the sensor wafer are materially bonded to one another. Preferably, this bonding is accomplished by eutectic bonding. For example, the bonding structure can be made of gold, which, when heated, bonds with the silicon of the two wafers to form a eutectic alloy. Preferably, the bonding structure is made partly or completely of germanium, and is joined to a further bonding structure made of aluminum, so that heating yields a material bond via a eutectic germanium-aluminum alloy.

It has turned out that in the etching process in which the bonding structure is formed from the previously applied bonding material, an overetching takes place, i.e., that not only the desired parts of the bonding material are removed, but also material is removed from the surface of the cap wafer, reducing the maximum height level available for the further structuring. The shift of the height level caused by the overetching is in the micrometer range, and results in a correspondingly changed vertical positioning of the stop surface of the stop structure.

The application according to the present invention of the hard mask advantageously prevents the reduction of the height level, and the stop surface is at the level of the original surface of the unprocessed wafer.

According to a preferred specific embodiment of the method according to the present invention, the movable structure of the sensor core includes two substructures connected to one another by a polysilicon bridge, such that in a rest state of the movable structure the polysilicon bridge is at a distance from an immovable structure of the sensor core, in a direction of excursion. The movable structure can be produced for example by growing an epitaxial silicon layer on a functional polysilicon layer (FP layer), the two substructures subsequently being etched from the epitaxial silicon layer. Here, the two substructures are situated above the FP layer. From the FP layer, the connecting element of the two substructures is formed, referred to in the following as the FP bridge. Alternatively, the movable structure can also have the shape of a trough in which one or more substructures form the edge and the FP layer forms the floor.

In such structures, there is the problem that the FP bridge can suffer damage due to impacts against an immovable structure of the sensor wafer. While, when there are large excursions of the movable structure, the substructures can be stopped by mechanical contact with one or more stop structures, such an impact of the FP bridge potentially causes damage to or destruction of the bridge, and therefore has to be avoided. Preferably, the stop surface of the cap is therefore positioned so that after the joining the distance between the stop surface and a surface in particular on an upper side of the movable structure or of one or both substructures comes out to be smaller than the distance of the FP bridge from the immovable structure of the sensor core. In this way, through a stopping of the movable structure on the stop surface, the FP bridge is advantageously prevented from impacting against the immovable structure and thus damaging the bridge.

According to a further preferred specific embodiment of the method according to the present invention, in a third step that precedes the first step an oxide layer is applied onto the cap wafer and, through etching of the oxide layer, a protective structure is produced that, during the connecting of the cap wafer with the sensor wafer, protects the sensor core against penetration of material from the bonding structure. During the bonding, the sensor formed from the cap wafer and sensor core is at least partially heated, so that the alloy partners bond to form the desired eutectic alloy. The protective structure advantageously prevents, for example, soft or liquid material of the bonding structure or of the alloy from flowing into the sensor core.

According to a further preferred specific embodiment of the method according to the present invention, in a fourth step, preceding the first step, a recess is produced by etching on the surface of the cap wafer, and in the first step a further hard mask is applied onto a further subregion of the cap wafer, the further subregion being situated inside the recess, and the masked further subregion of the cap wafer defining a surface of a capping electrode. Preferably, the fourth step takes place after the third step. In this specific embodiment of the method according to the present invention, in addition to the stop structure a capping electrode is formed as part of the cap wafer. In order to prevent this capping electrode from being situated at the same height level as the stop structure, before the actual formation of the capping electrode a recess is formed in which a surface is defined by the hard mask that points to the sensor wafer after the joining. In this way, analogous to the first step of the method according to the present invention, a further removal of material is avoided during the etching of the bonding structure. The positioning in the recess brings it about that the surface of the capping electrode is situated at a lower height level than the stop surface of the stop structure. After the joining, the distance between the movable structure and the stop surface is therefore smaller than that between the movable structure and the capping electrode. In this way, when there are large excursions the movable structure is advantageously stopped before it impacts the capping electrode.

According to a further preferred specific embodiment of the method according to the present invention, in a fifth step, following the second step, through etching a recess is produced in order to form a cavern. During the joining of the cap wafer with the sensor wafer, the recess of the cap forms the upper part of the cavern in which the sensor core is enclosed.

According to a further preferred specific embodiment of the method according to the present invention, in a sixth step, following the second step, the hard mask is removed. If a further hard mask was also applied in the first step, it is preferably also removed in the sixth step. Preferably, this step takes place before the fifth step.

According to a further preferred specific embodiment of the method according to the present invention, in a seventh step, preceding the sixth step, the bonding structure and/or the protective structure are provided with a protective lacquer that protects the bonding structure and/or the protective structure from removal of material during the removal of the hard mask. Preferably, this step takes place after the second step.

The present invention also provides a microelectromechanical sensor.

According to a preferred specific embodiment of the sensor according to the present invention, the cap wafer has a capping electrode that is situated in a recess of the cap wafer, such that in the rest state the movable structure is situated at a third distance, in the direction of excursion, from a surface of the capping electrode, the third distance being greater than or equal to the second distance.

Alternatively or in addition to the specific embodiment described above of the microelectromechanical sensor according to the present invention, the advantageous embodiments and features explained in connection with the method can also be used in the sensor, by themselves or in combination.

DETAILED DESCRIPTION OF EXAMPLE EMBODIMENTS

Figure 1A:
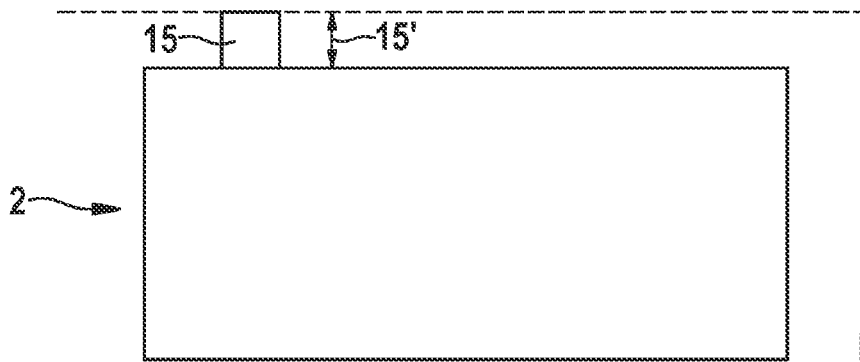
FIGS. 1a, 2a, 3a, 4a, 5a, 6a, 7a, and 8a schematically show a cap wafer in various successive stages of a production method according to the related art.

In the figures, FIGS. 1c, 2c, 3c, 4c, 5c, 6c, 7c, 8c, and 9c correspond to various stages in the production process of a cap wafer 2, or of the sensor 1 formed thereby, according to a specific embodiment of the method according to the present invention. FIGS. 1b, 2b, 3b, 4b, 5b, 6b, 7b, 8b, and 9b show a variant of the method according to the present invention in which, in addition to stop structure 7, a capping electrode 17 is formed as part of cap wafer 2. FIGS. 1a, 2a, 3a, 4a, 5a, 6a, 7a, 8a, and 9a show a production method according to the related art. The respectively corresponding stages of the various production processes are shown one over the other (see for example the sequence of FIGS. 1a, 1b, 1c, which show the respective first substep at the beginning of the processing of the cap wafer), so that the differences, in particular missing or additional substeps, can easily be worked out. In the various Figures, identical or equivalent parts are always provided with the same reference characters, and are therefore as a rule also each named or mentioned only once.

Figure 1B:
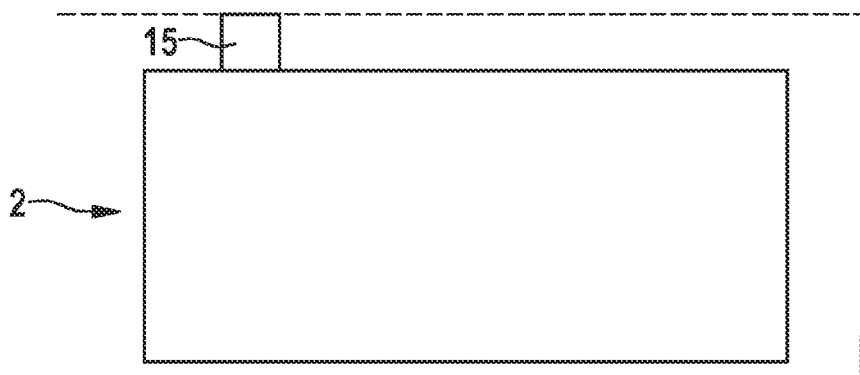
FIGS. 1b, 2b, 3b, 4b, 5b, 6b, 7b, and 8b schematically show a cap wafer in various stages of a specific embodiment of the production method according to the present invention.
Figure 1C:
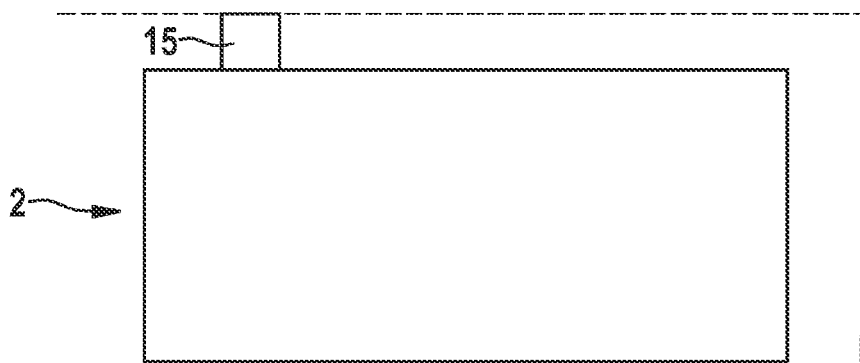
FIGS. 1c, 2c, 3c, 4c, 5c, 6c, 7c, and 8c schematically show a cap wafer in various stages of a further specific embodiment of the production method according to the present invention.

As is shown in FIGS. 1a through 1c, at the beginning of the processing of cap wafer 2 a protective structure 15, having a typical thickness 15' between 1.1 µm and 1.7 µm, is produced by deposition and structuring of an oxide. As is described in more detail below in relation to FIGS. 9a through 9c, this protective structure 15 is used to prevent, during heating of bonding material 4', 25, bonding material 4', 25 from penetrating into sensor core 5 and impairing or damaging the functional components of the microelectromechanical structure.

Figure 2A:
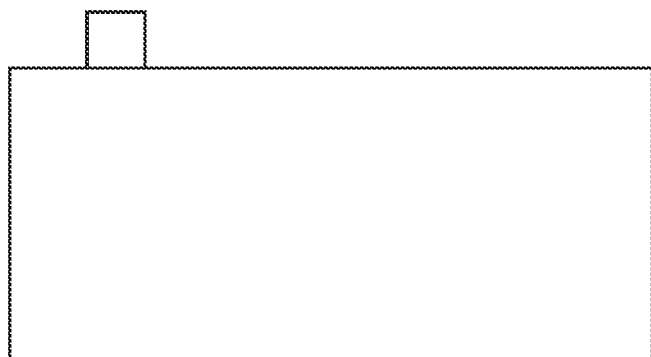
Figure 2B:
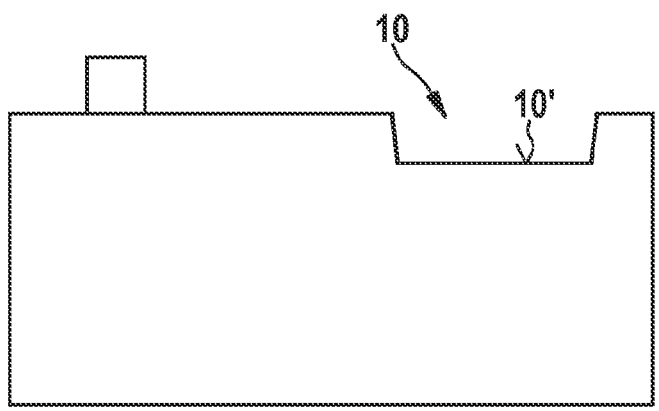
Figure 2C:
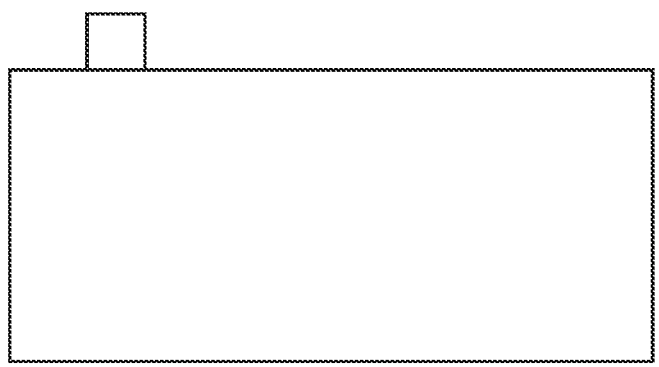

As is shown in FIG. 2b, a recess 10 of cap wafer 2 is formed in a substep that follows the deposition and structuring of protective oxide 15. In the level defined by floor surface 10' of recess 10, a capping electrode 17 of cap wafer 2 is formed in the subsequent substeps. This substep is not present in the production methods shown in FIGS. 2a and 2c, in which no such formation of a capping electrode 17 takes place.

Figure 3A:
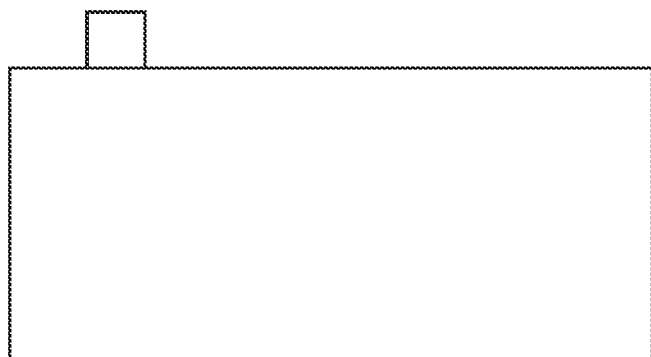
Figure 3B:
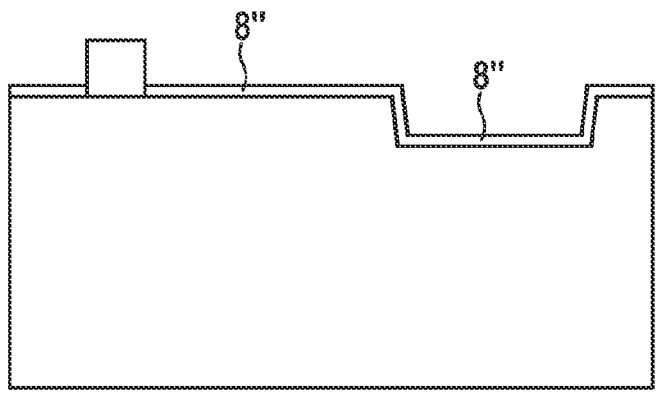
Figure 3C:
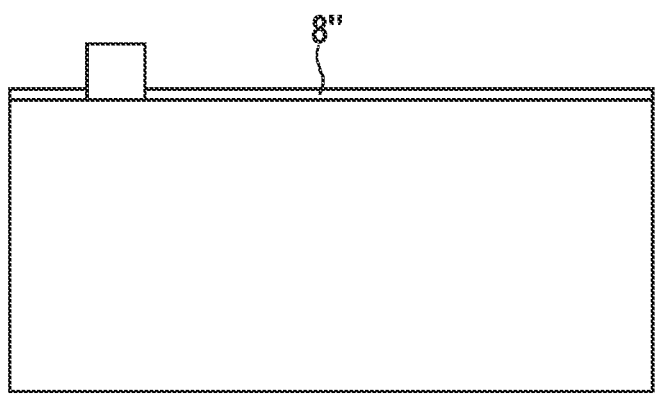
Figure 4A:
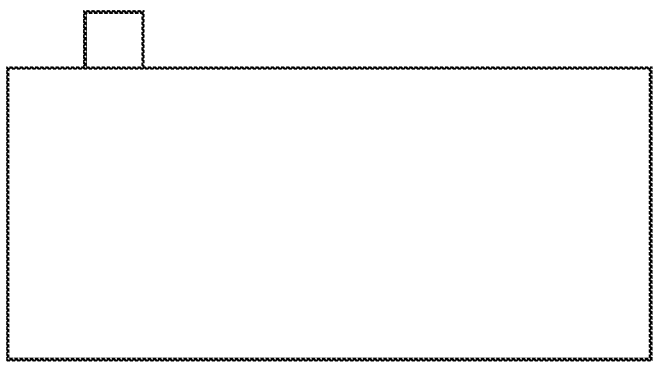
Figure 4B:
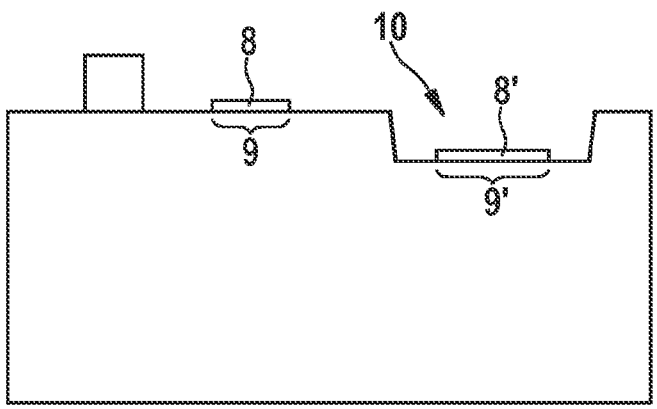
Figure 4C:
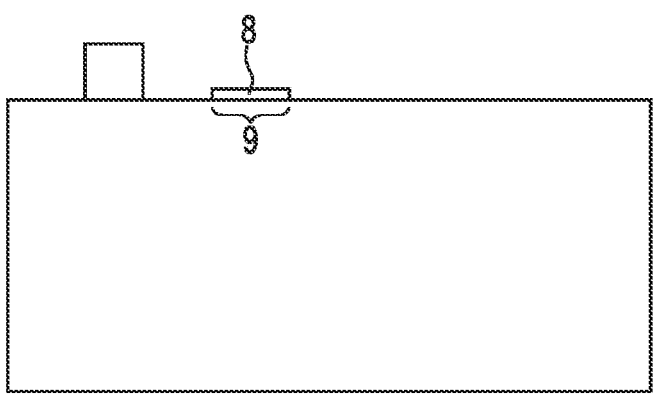

In the following, as is shown in FIGS. 3b and 3c, a hard mask oxide 8" is deposited on the surface of cap wafer 2. As can be seen in FIGS. 4b and 4c, through structuring, a hard mask 8 or 8a' is subsequently formed from hard oxide layer 8", each mask covering particular subregions 9, 9' of the wafer surface and protecting them against removal of material during subsequent etching. In the variant shown in FIG. 4c, not having capping electrode 17, mask 8 covers a subregion 9 that protects a subsurface of wafer 2 against being material removal, which subsurface will later form stop surface 7' of stop structure 7. In the variant shown in FIG. 4b, hard masks 8, 8' cover two subregions 9, 9', of which the first subregion 9 again defines stop surface 7' of stop structure 7, while further subregion 9' in recess 10 defines a surface 17' of capping electrode 17. The production of hard mask 8 according to FIGS. 3b, 3c, and 4b, 4c corresponds to the first step of the method according to the present invention, and is not present in FIGS. 3a and 4a, which show the method according to the related art.

Figure 5A:
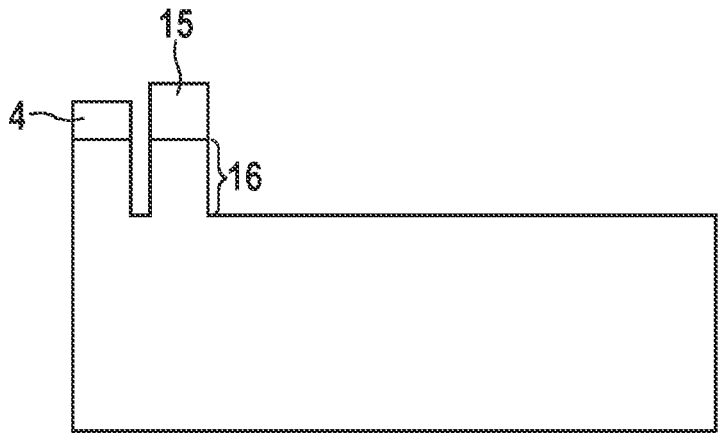
Figure 5B:
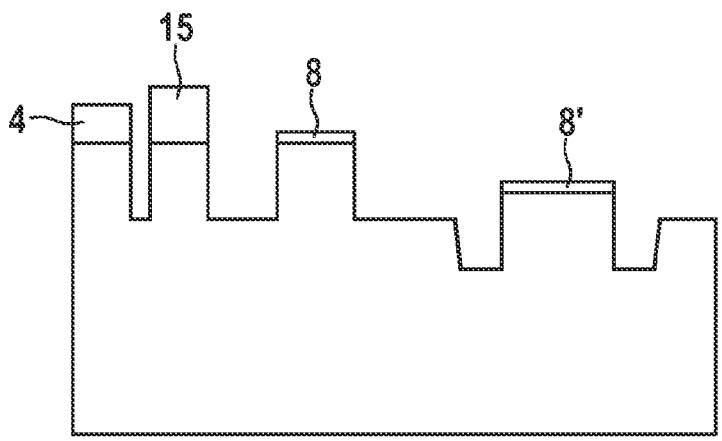
Figure 5C:
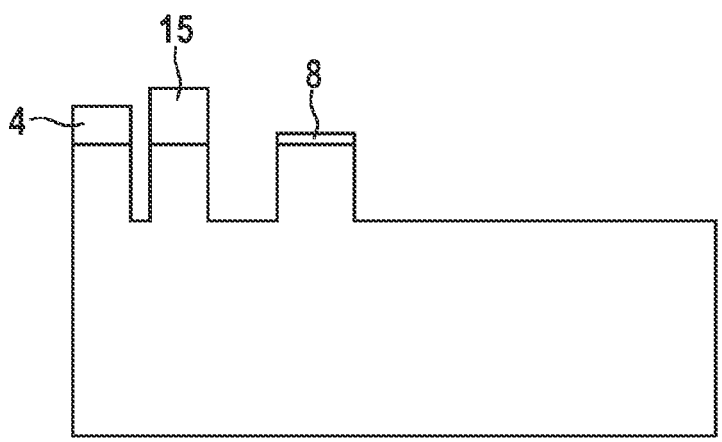

In the next substep, bonding structure 4 is produced, with which cap wafer 2 is later connected to sensor wafer 3. For this purpose, a germanium layer is deposited and structured by etching. This corresponds to a specific embodiment of the second step of the method according to the present invention. As can be seen in FIGS. 5a through 5c, here overetching results in an additional height difference 16; i.e., the etching not only structures the germanium layer but also removes material from the rest of the surface of cap wafer 2. Through the resulting surface 16', in the related art as shown in FIG. 5a the level is defined that forms the starting point of all subsequent structuring processes and that therefore defines the maximum height of the subsequently formed structures. In the variants of the method according to the present invention shown in FIGS. 5b and 5c, in contrast, the areas covered by masks 8 or 8' are protected against the overetching, so that the covered surfaces remain at the original height level, and are thus in particular situated higher than surface 16' in FIG. 5a, which was formed using the conventional method from the related art.

Figure 6A:
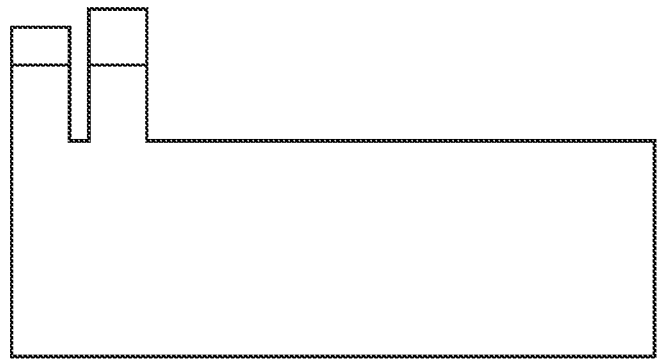
Figure 6B:
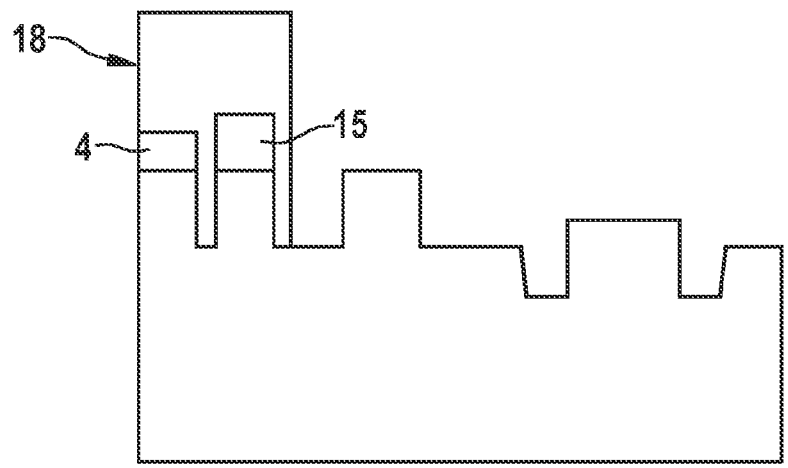
Figure 6C:
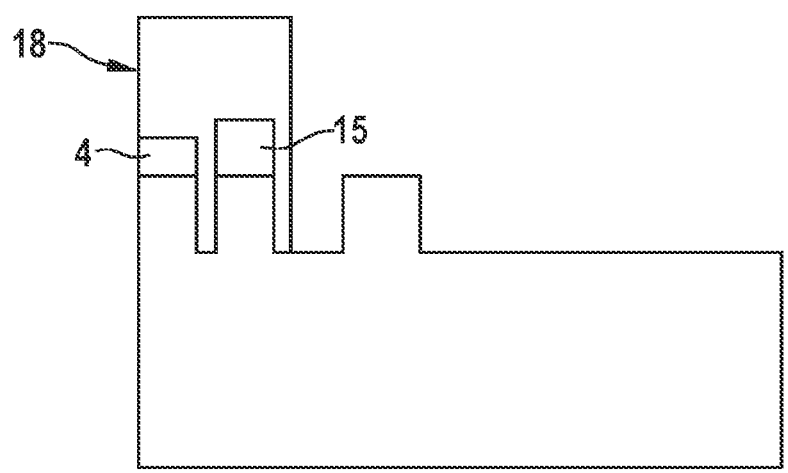

In the next substep, protective structure 15 and bonding structure 4, as shown in FIGS. 6b and 6c, are provided with a protective lacquer 18 and hard mask 8, 8' is removed. Here, protective lacquer 18 is used to protect protective structure 15 and bonding structure 4 when hard mask 8, 8' is removed.

Figure 7A:
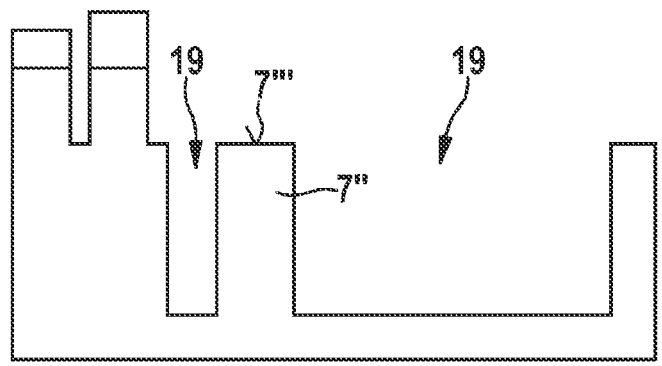
Figure 7B:
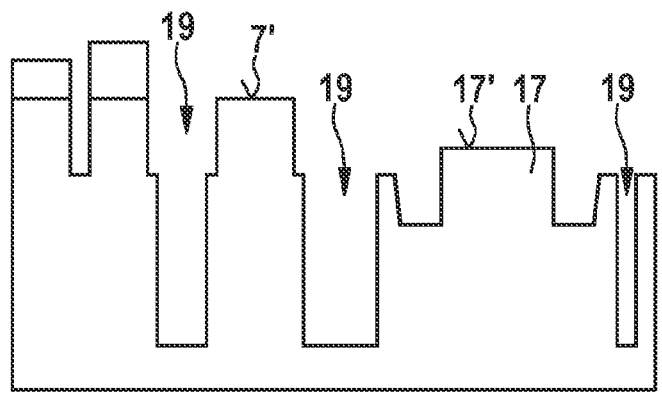
Figure 7C:
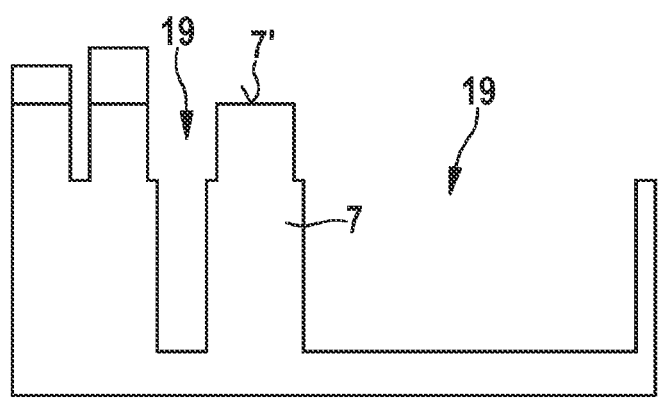

As is shown in FIGS. 7a through 7c, subsequently a cavern trench is carried out; i.e. by trenching of particular regions, for example using a lacquer mask, a recess 19 is created that later, during the joining with sensor wafer 3, forms the cavern in which sensor core 5 is enclosed. As is shown in FIGS. 7b and 7c, at the same time the remaining part of stop structure 7, or the capping electrode (in FIG. 7b), is formed. In the method according to the related art, in this substep the overall height of stop structure 7" is formed, whose stop surface 7'" is situated at the level of surface 16' shown in FIG. 5a. As can be seen from a comparison of FIG. 7a with FIGS. 7b and 7c, stop surface 7' of stop structures 7 shown in FIGS. 7b and 7c, which were produced using variants of the method according to the present invention, is situated significantly higher than stop surface 7'" produced using the conventional method.

Figure 8A:
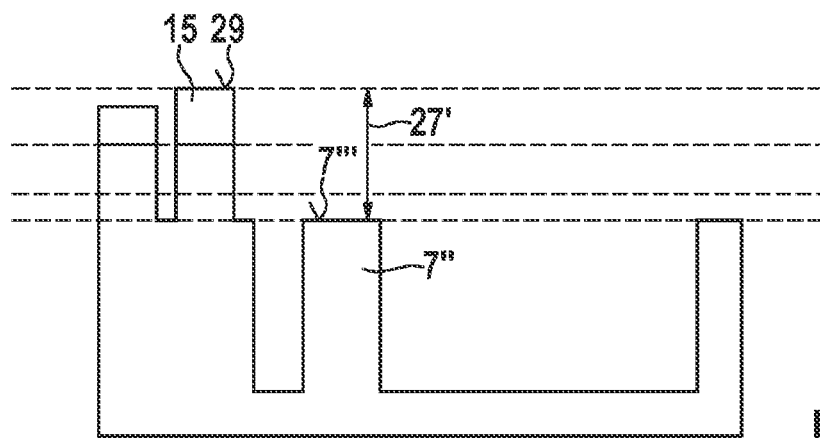
Figure 8B:
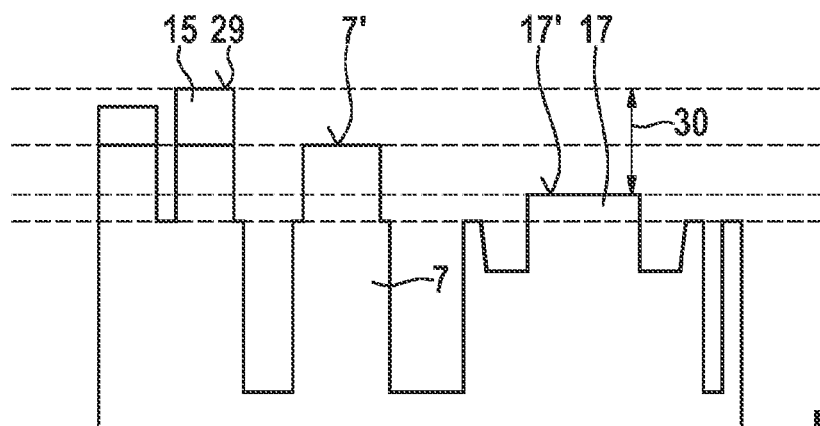
Figure 8C:
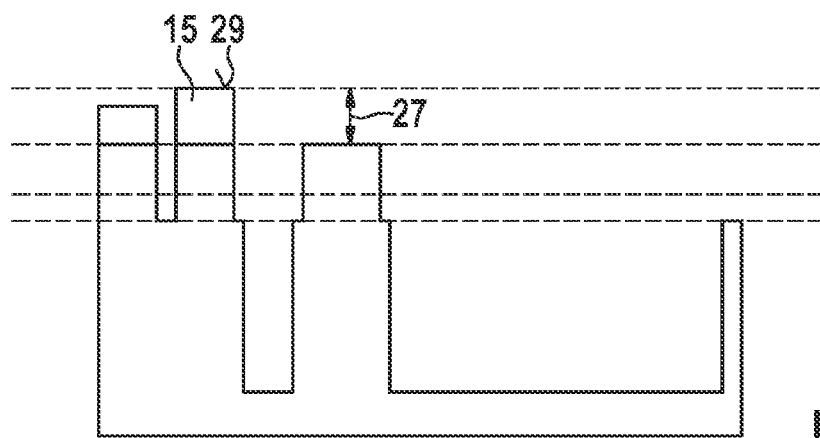

In FIGS. 8a through 8c, the height difference is 27, 27', 28, produced by the various methods, of the structures of cap wafer 2 are shown. In each case the highest point is formed by upper side 29 of protective structure 15. In the method from the related art shown in FIG. 8a, height difference 27' between highest level 29 and stop surface 7'" of stop structure 7" is typically 2.5 micrometers to 3.5 micrometers. In the two specific embodiments of the method according to the present invention shown in FIGS. 8b, and 8c, in contrast, height difference 27 is determined exclusively by the thickness of protective structure 15, and is typically 1.1 µm to 1.7 µm. Distance 30 between highest level 29 and upward-pointing surface 17' of capping electrode 17 is selected somewhat larger than distance 27, and, as can be seen in the next FIG. 9b, determines, in assembled sensor 1, a height difference 22 between surface 17' of the capping electrode and the upper edge of movable structure 6.

Figure 9A:
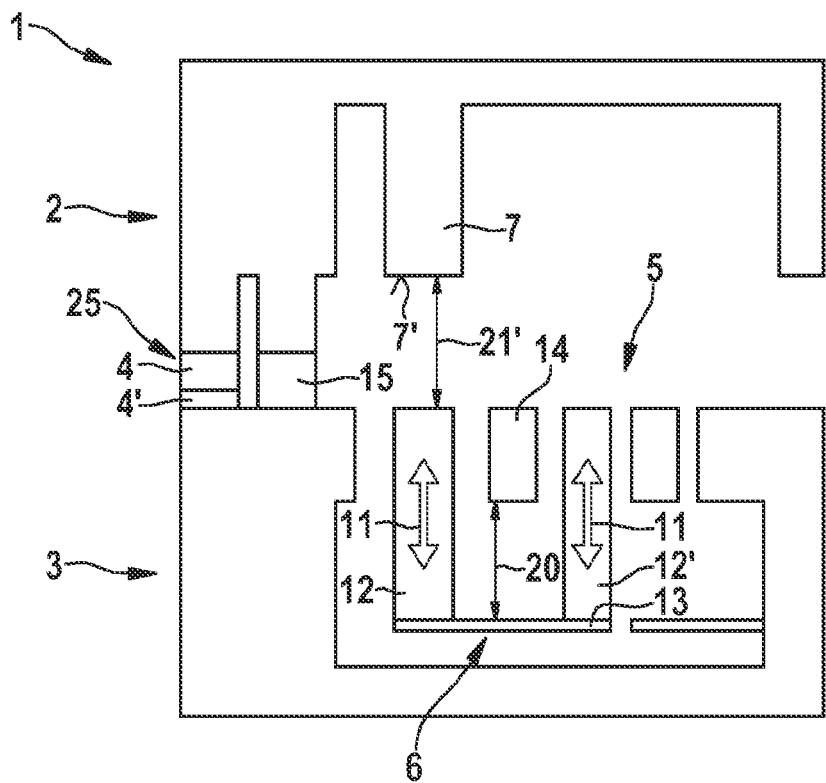
FIG. 9a schematically shows a sensor according to the related art, formed by joining a sensor wafer and a cap wafer.
Figure 9B:
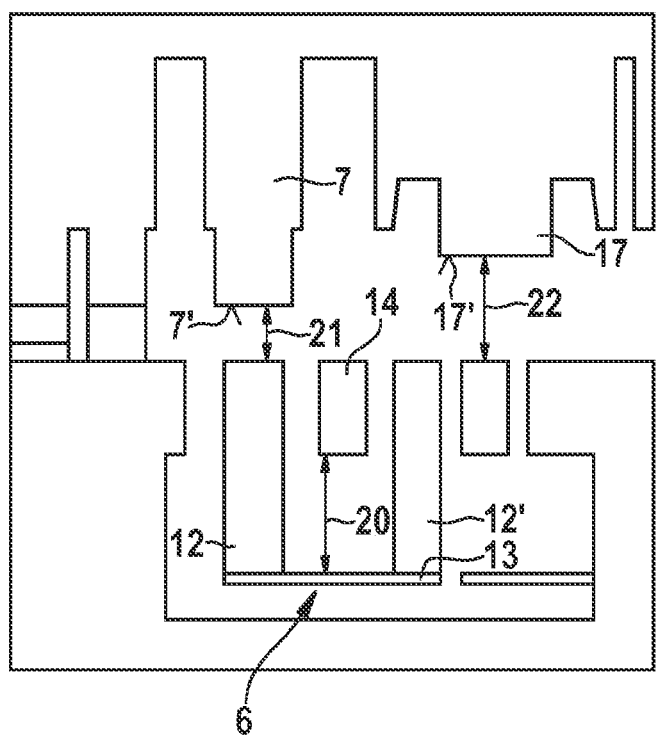
FIG. 9b schematically shows a specific embodiment of the microelectromechanical sensor according to the present invention formed by joining a sensor wafer and a cap wafer.
Figure 9C:
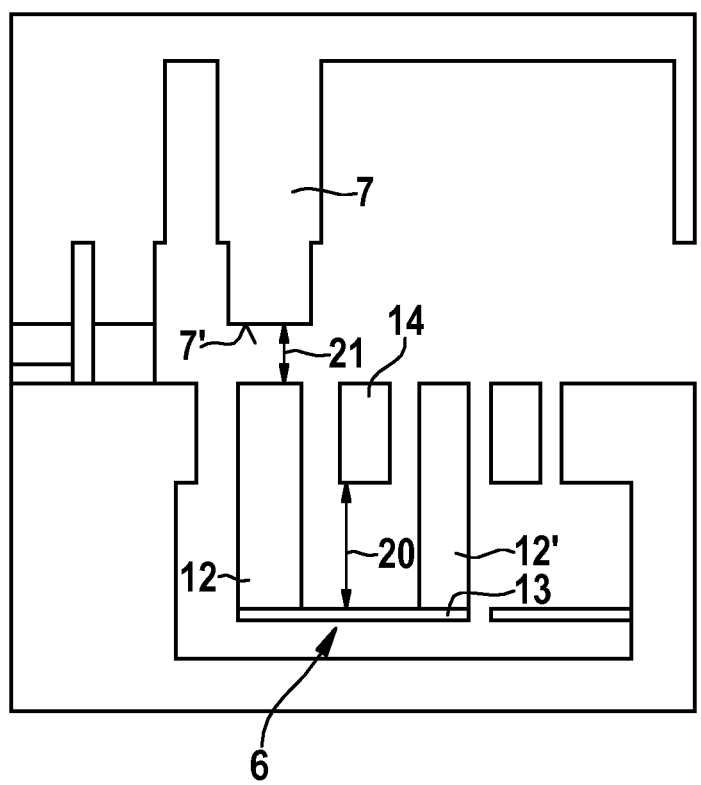
FIG. 9c schematically shows a further specific embodiment of the microelectromechanical sensor according to the present invention formed by joining a sensor wafer and a cap wafer.

FIGS. 9a through 9c show sensors 1 produced by the various methods and made up of a cap wafer 2 and a sensor wafer 3. Outside protective structure 15, between cap wafer 2 and sensor wafer 3 there is situated a connecting element 25 made of germanium bonding structure 4 and an aluminum bonding structure 4'. For the subsequent eutectic bonding, from alloy partners 4, 4' a eutectic alloy forms that materially bonds cap wafer 2 and sensor wafer 3 to one another. In the figure, only a part of connecting element 25 can be seen, which in its totality completely surrounds sensor core 5, and, during the eutectic bonding, hermetically separates the cavern from the external space. Protective structure 15 likewise surrounds the entire sensor core 5 and prevents liquid alloy material from moving into the sensor core when connecting element 25 is melted.

Sensor wafer 3 has a movable structure 6 made of two substructures 12, 12' that are connected to one another by an FP bridge 13. An immovable structure 14 of the sensor core is situated between substructures 12 and 12'. When movable structure 6 moves in excursion direction 11, the amplitude of the movement is limited by stop structure 7 of cap wafer 2. When there are strong excursions, substructure 12 impacts stop surface 7' of stop structure 7 and in this way prevents excursions that are greater than distance 21, or 21', between stop surface 7' and substructure 12. Preferably, stop structure 7 is formed in such a way that both substructure 12 and substructure 12' impact stop structure 7 when there are strong excursions, and are stopped in this way. In sensor 1, produced according to the related art, in FIG. 9*a*, here there results the problem that distance 21' comes out to be smaller than distance 20 between FP bridge 13 and immovable structure 14, so that when there is a correspondingly large amplitude of the excursion there is the danger that FP bridge 13 will impact immovable structure 14 and will be mechanically damaged or even destroyed.

In contrast, in sensors 1 shown in FIGS. 9*b* and 9*c*, produced using specific embodiments of the method according to the present invention, distance 21 is significantly smaller, and in particular is smaller than distance 20 between FP bridge 13 and immovable structure 14. In this way, movable structure 6 is caught by surface 7' of stop structure 7 before FP bridge 13 can be damaged. In the variant having capping electrode 17 in FIG. 9*b*, distance 22 between the upper edge of cap wafer 2 and capping electrode 17 is equal to distance 20 between FP bridge 13 and immovable structure 14. In this way it is ensured that, when there are strong excursions, movable structure 6 is damaged neither by a mechanical contact between FP bridge 13 and immovable structure 14 nor by a contact between movable structure 6 and capping electrode 17.

What is claimed is:

1. A method for producing a microelectromechanical sensor, the method comprising:
   connecting a cap wafer with a sensor wafer, the cap wafer having a bonding structure for connecting the cap wafer with the sensor wafer, the sensor wafer having a sensor core having a movable structure, and the cap wafer having a stop structure configured to limit an excursion of the movable structure;
   wherein the method has a first step and a second step following the first step, a hard mask being applied onto a subregion of the cap wafer in the first step, the masked subregion of the cap wafer defining a stop surface of the stop structure, a bonding layer being applied onto the cap wafer in the second step, and the bonding structure being produced by etching the bonding layer,
   wherein, in a third step, preceding the first step, an oxide layer is applied onto the cap wafer and a protective structure is produced by etching the oxide layer, the protective structure protecting the sensor core against penetration of material from the bonding structure during the connection of the cap wafer with the sensor wafer.

2. The method as recited in claim 1, wherein, in a sixth step, following the second step, the hard mask is removed.

3. The method as recited in claim 2, in which, in a seventh step, following the sixth step, the bonding structure and/or the protective structure is provided with a protective lacquer that protects the bonding structure and/or the protective structure from removal of material during the removal of the hard mask.

4. A method for producing a microelectromechanical sensor, the method comprising:
   connecting a cap wafer with a sensor wafer, the cap wafer having a bonding structure for connecting the cap wafer with the sensor wafer, the sensor wafer having a sensor core having a movable structure, and the cap wafer having a stop structure configured to limit an excursion of the movable structure;
   wherein the method has a first step and a second step following the first step, a hard mask being applied onto a subregion of the cap wafer in the first step, the masked subregion of the cap wafer defining a stop surface of the stop structure, a bonding layer being applied onto the cap wafer in the second step, and the bonding structure being produced by etching the bonding layer,
   in which, in a fourth step, preceding the first step, a recess is produced on a surface of the cap wafer by etching, and, in the first step, a further hard mask is applied onto a further subregion of the cap wafer, the further subregion being situated inside the recess, and the masked further subregion of the cap wafer defining a surface of a capping electrode.

5. A method for producing a microelectromechanical sensor, the method comprising:
   connecting a cap wafer with a sensor wafer, the cap wafer having a bonding structure for connecting the cap wafer with the sensor wafer, the sensor wafer having a sensor core having a movable structure, and the cap wafer having a stop structure configured to limit an excursion of the movable structure;
   wherein the method has a first step and a second step following the first step, a hard mask being applied onto a subregion of the cap wafer in the first step, the masked subregion of the cap wafer defining a stop surface of the stop structure, a bonding layer being applied onto the cap wafer in the second step, and the bonding structure being produced by etching the bonding layer,
   wherein, in a fifth step, following the second step, a recess for the formation of a cavern is produced by etching.

\* \* \* \* \*